United States Patent [19]

Ham

[11] Patent Number: 5,731,614
[45] Date of Patent: Mar. 24, 1998

[54] ELECTROSTATIC PROTECTIVE DEVICE HAVING ELONGATE GATE ELECTRODES IN A LADDER STRUCTURE

[75] Inventor: Seog-Heon Ham, Seoul, Rep. of Korea

[73] Assignee: Samsung Electronics Co., Ltd., Suwon, Rep. of Korea

[21] Appl. No.: 752,960

[22] Filed: Dec. 2, 1996

[30]     Foreign Application Priority Data

Dec. 2, 1995 [KR] Rep. of Korea .................. 95-46231

[51] Int. Cl.⁶ ............................................. H01L 23/62
[52] U.S. Cl. ........................... 257/355; 257/360; 257/401
[58] Field of Search .................................. 257/355–360, 257/362, 365, 401

[56]     References Cited

U.S. PATENT DOCUMENTS 5,208,474  5/1993  Yamagata et al. ........................ 257/360
5,623,387  4/1997  Li et al. .................................... 257/355

FOREIGN PATENT DOCUMENTS 1-286354  11/1989  Japan ........................................ 257/360

*Primary Examiner*—Wael Fahmy
*Assistant Examiner*—David B. Hardy
*Attorney, Agent, or Firm*—Jones & Volentine, L.L.P.

[57]     ABSTRACT

A plurality of transistors are aligned to form a ladder structure between two well contacts in a semiconductor substrate, the ladder structure including a plurality of elongate gate contacts extending parallel to one another, a plurality of elongate source contacts extending parallel to one another, and a plurality of elongate drain contacts extending parallel to one another, wherein the source contacts and the drain contacts are alternately arranged between the gate contacts. In the ladder structure, a first distance is made greater than a second distance to prevent current localization at respective junctions between a first drain contact and adjacent gate contacts located on opposite sides of the first drain contact, the first drain contact being a one of the plurality of drain contacts which is spaced furthest away from both the two well contacts. The first distance is a distance between the first drain contact and each of the adjacent gate contacts located on opposite sides of the first drain contact, and the second distance is a distance between each of the remaining drain contacts and each of the gate contacts adjacent to the remaining drain contacts.

7 Claims, 5 Drawing Sheets

ELECTROSTATIC PROTECTIVE DEVICE HAVING ELONGATE GATE ELECTRODES IN A LADDER STRUCTURE

BACKGROUND OF THE INVENTION

1. Field of the Invention

The present invention relates to a semiconductor device, and in particular, to an electrostatic protective device using N-channel MOS (metal oxide semiconductor) components.

2. Description of the Related Art

The N-channel MOS device is frequently employed as an electrostatic protective device in CMOS circuits. The electrical characteristics of such N-channel MOS devices are more favorable than those of the diode, particularly with respect to trigger voltage, snap-back voltage, dynamic resistance, etc. On the other hand, the N-channel MOS device suffers a disadvantage in that the leak current thereof is greater than that of the diode.

To increase the efficiency of electrostatic protection, the N-channel MOS device must be made to have a gate which is as wide as possible, and further, the N-channel MOS device must be subjected to a process in which impurity ions of a same conductivity type as a drain thereof are injected into the gate at a high energy. That is, the electrostatic protection efficiency of the N-channel MOS device is proportional to the gate width thereof. In the event that the chip size or the circuit layout prevent a necessary enlargement of the gate width, the N-channel MOS is constructed having a ladder or comb-like structure in which gate "fingers" (i.e., elongate segments) are arranged in parallel to one another.

Referring to FIGS. 1A, 1B, 1C and 2, a conventional N-channel MOS electrostatic protective device of a ladder structure (or, a finger structure) includes plural gate fingers 12 arranged in parallel with one another, with drain electrodes 10 and source electrodes 14 alternatively arranged between the gate fingers 12. The width between a gate finger 12 and an adjacent drain electrode 10 is the same at any of the illustrated positions, i.e., B1=B2=B3. Typically, the gate fingers 12 and a substrate 2 are grounded. N-channel MOS transistors are formed in a p-type well 4 in the substrate 2, and are defined between device isolation regions 6 located at opposite ends of the well 4.

In such a configuration, as shown by the hatching 18 of FIGS. 1A and 1C, current localization occurs between the drain electrode 10, which extends between a pair of gate fingers 12, and the adjacent gate fingers 12. This is caused by a well resistance that is generated due to a difference in distance between a p+type well contact 16 and a source electrode 14. At a position where this distance differential is short, holes that are generated in the drain junction almost entirely escape into the well contact 16 so that a triggering of the source junction later occurs. On the other hand, at a position where the distance differential is relatively long, the holes generated in the drain junction only partially escape into the well contact 16 and the remainder pile up under the source junction so that a triggering of the source junction occurs earlier.

Therefore, the holes of the electron-pairs which occur at the respective drains due to impact ionization partially escape into the p+type well contact 16 and the remainder pile up under the n+type source junction, which in mm makes the relative electric potential of the well higher than that of the source. The source-well junction is then turned on since it serves as a diode. This phenomena takes place more frequently as the well resistance increases at a source spaced far away from the well contact 16. As shown in FIGS. 1A and 1C, the source adjacent to the hatched portion 18, that is, the source adjacent the drain 10 which is spaced furthest from the well contact 16, is turned on earlier than that of the other drains, and current is thus localized therein. Here, turning on of the source effectively means that the source-well junction serving as a diode is turned on.

Thus, when the N-channel MOS devices are employed as an electrostatic protective device, a problem arises in that the above-described current localization reduces the electrostatic protection efficiency.

SUMMARY OF THE INVENTION

It is therefore an object of the present invention to provide an electrostatic protective device in which the drain fingers thereof have the same triggering voltages so as to improve the electrostatic protection efficiency thereof.

It is another object of the present invention to provide an electrostatic protective device in which current at a drain junction spaced furthest away from a well contact flows almost entirely into the other drain junctions so as to prevent current localization at the drain junction.

According to an aspect of the present invention, an electrostatic protective device having a ladder structure in which plural gate fingers are arranged in parallel to one another, includes a semiconductor substrate, a well and two well contacts formed on the semiconductor substrate, and a plurality of MOS transistors formed in series between the two well contacts on the well, each of the MOS transistors having a drain contact connected to a first power source, a source contact connected to a second power source and a gate contact also connected to the second power source. A first distance between a first drain contact, which is spaced furthest away from the two well contacts, and the gate contacts positioned on opposite sides of the first drain contact is greater than a second distance between each of the remaining drain contacts and the gate contacts positioned on opposite sides of each of the remaining drain contacts.

According to another aspect of the present invention, an electrostatic protective device having a plurality of MOS transistors forming a ladder structure is coupled to an input of an internal circuit between first and second voltage sources and includes gate fingers arranged in parallel and source and drain contacts alternately arranged between the gate fingers, wherein a first width of the ladder structure is greater than a second width of the ladder structure, the first width being a distance between a first drain contact, which is spaced furthest away from a well contact on a semiconductor substrate, and the gate fingers on opposite sides of the first drain contact, and the second distance being a distance between each of the remaining drain contacts and the gate fingers on opposite sides thereof.

In the preferred embodiment, each of the MOS transistors is composed of an N-channel MOS transistor.

THE BRIEF DESCRIPTION OF THE DRAWINGS

The above and other objects and aspects of the invention will become apparent to those skilled in the art from the detailed description which follows with reference to the accompanying drawings, in which.

DETAILED DESCRIPTION OF THE PREFERRED EMBODIMENTS

Figure 3:
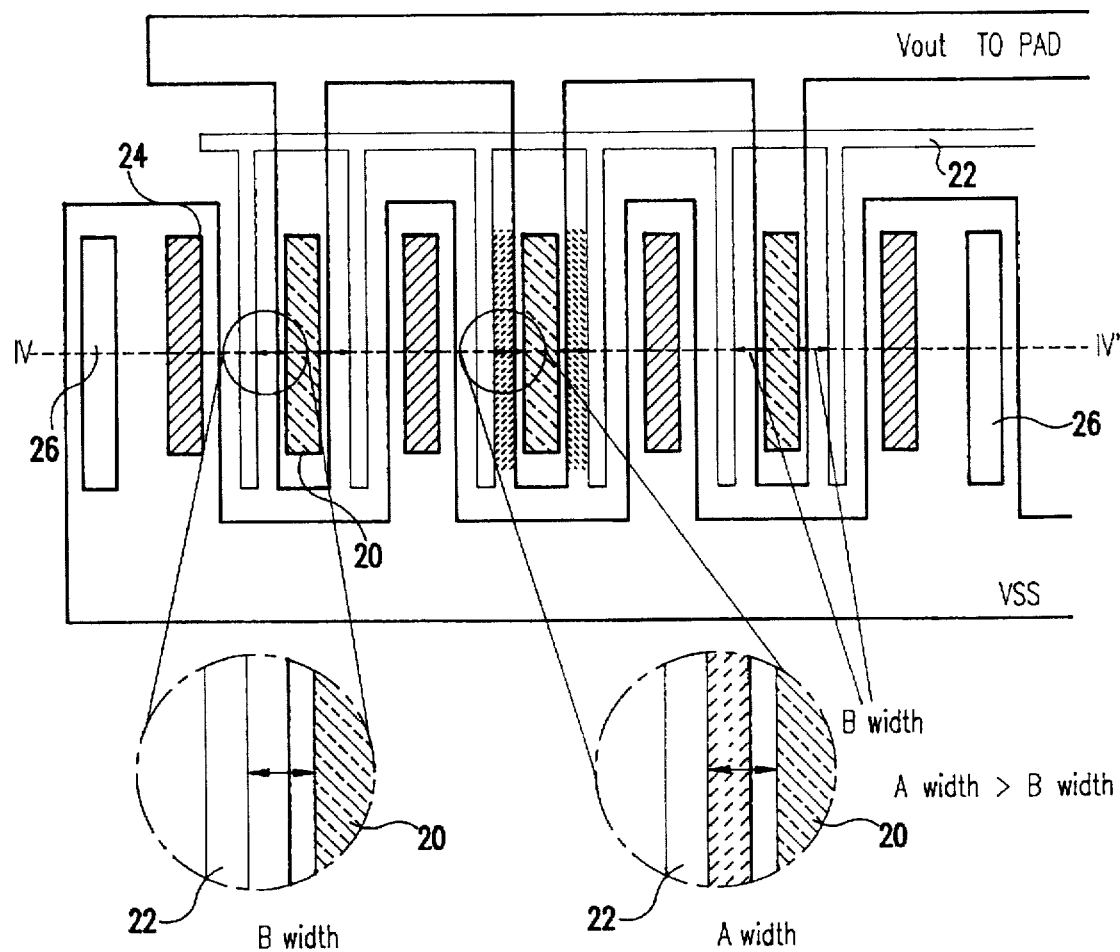
FIG. 3A is a plan view showing an input/output layout of a novel NMOS electrostatic protective device in accordance with an embodiment of the present invention and FIGS. 3B and 3C are enlarged views of portions of FIG. 3A.

Referring first to FIGS. 3A, 3B and 3C, a novel electrostatic protective device according to an embodiment of the present invention is composed of N-channel MOS devices defining a ladder structure, in which each drain is connected to a primary voltage source Vout and each source is connected to a secondary voltage source Vss. An internal circuit is connected between the voltage sources Vout and Vss for which the N-channel MOS devices are providing electrostatic protection. In the N-channel MOS device structure of the electrostatic protective device of the present invention, a width $A_{width}$ between the drain contact 20, which is spaced furthest away from the well contacts 26, and each of the gates 22 on opposite sides of the drain contact 20, is greater than a width $B_{width}$ between each of the remaining drain contacts 20 and each of the gates 22 adjacent thereto.

As also shown in FIG. 3A, the ladder structure of the N-channel MOS devices is defined by the gate fingers 22 being arranged in parallel to one another, and the source contacts 24 and the drain contacts 20 being alternately arranged in parallel to one another between the gate fingers 22.

Figure 4:
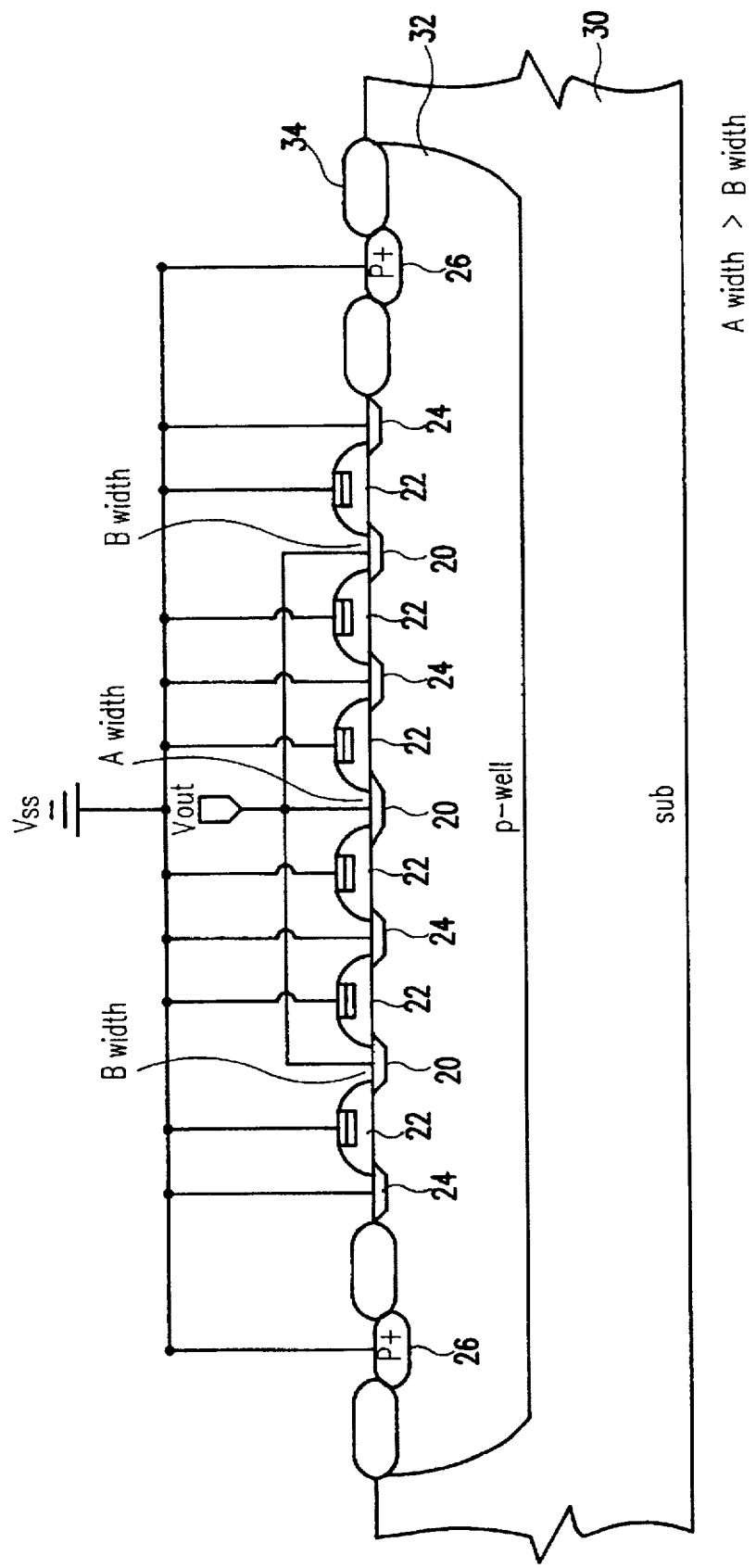
FIG. 4 is a cross-sectional view taken along line IV—IV' of FIG. 3.

FIG. 4 shows a vertical cross-sectional view of the electrostatic protective device taken along the line IV—IV' of FIG. 3A. The MOS devices are formed on a p-type well 32 in a semiconductor substrate 30, and defined between device isolation regions 34 located at opposite ends of the well 32. In FIG. 4, reference symbol $A_{width}$ denotes as above a distance between the drain contact 20, which is spaced furthest away from the well contacts 26, and each of the two adjacent gates on opposite sides of the drain contact 20, and reference symbol $B_{width}$ denotes as above the distance between each of the remaining drain contacts 20 and each of the adjacent gates 22 on opposite sides thereof.

As can be seen from FIGS. 3A, 3B, 3C and 4, the electrostatic protective device of the present invention is characterized by an N-channel MOS ladder structure in which the width $A_{width}$ is greater than the width $B_{width}$.

If, in accordance with the present invention, the width $A_{width}$ associated with the drain at which triggering is apt to occur most early is enlarged relative to the width $B_{width}$ associated with the remaining drains, a triggering voltage or current does not result during operation of the electrostatic protective device since current localization does not occur between the most early triggering drain and the respective gate fingers on opposite sides thereof. Only a drain voltage Vout is increased. This voltage Vout is applied to the drain when an overcurrent is generated after the device is mined on.

Figure 5:
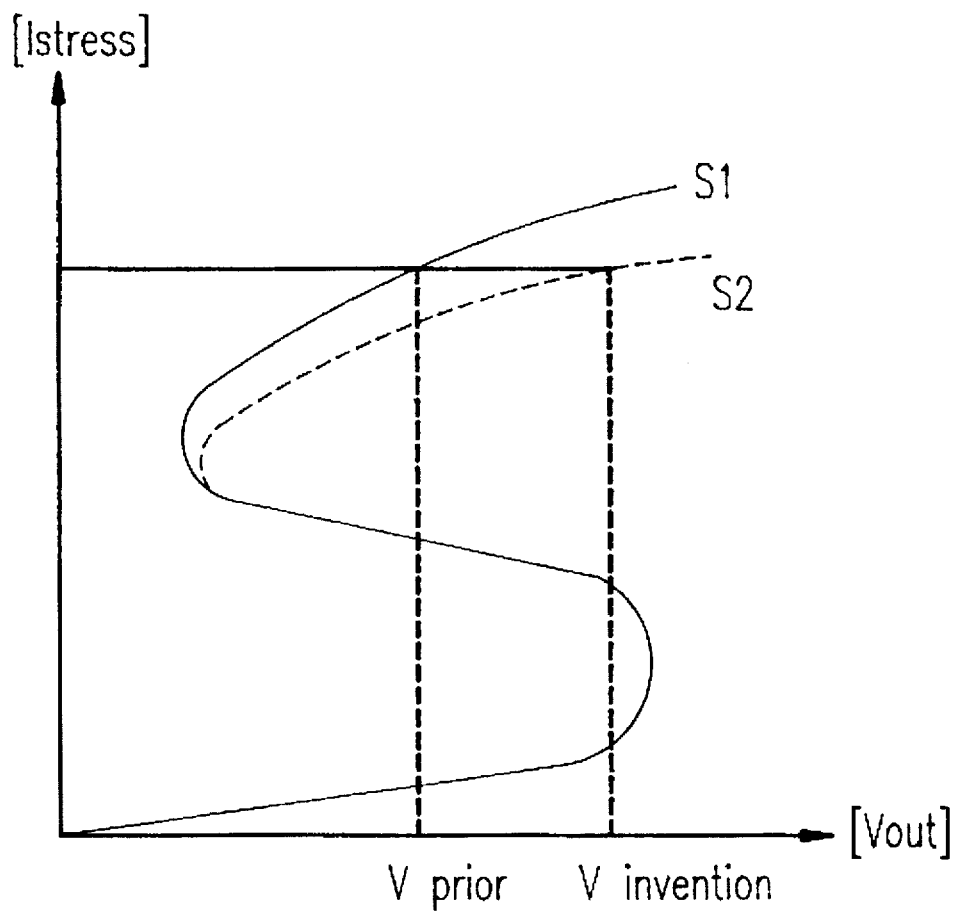
FIG. 5 is a diagram showing a relationship between an output voltage (or drain voltage) and stress current in the electrostatic protective device of the present invention.

More precisely, since a device resistance prior to triggering is in a range of several mega ohms (MΩ) to several hundred mega ohms (MΩ), there is effectively no change in the triggering voltage and triggering current even if $A_{width}$ is larger than $B_{width}$ and the linear resistance is thus increased. On the other hand, after triggering, a dynamic resistance $R_{dynamic}$ occurs in the range of several ohms (Ω) to several tens of ohms (Ω), and the drain voltage is increased as shown in FIG. 5. As a result, an overcurrent flows into the remaining drains. This drain voltage Vout is characterized by the following equation:

$$Vout \text{ (after triggering)} = I_{stress}(R_{dynamic} + R_A)$$

where $R_A$ denotes an increment of linear resistance that results from extending the distance between the gate and the drain contact, and $I_{stress}$ denotes a stress current.

Figures 1A, 1B, 1C:
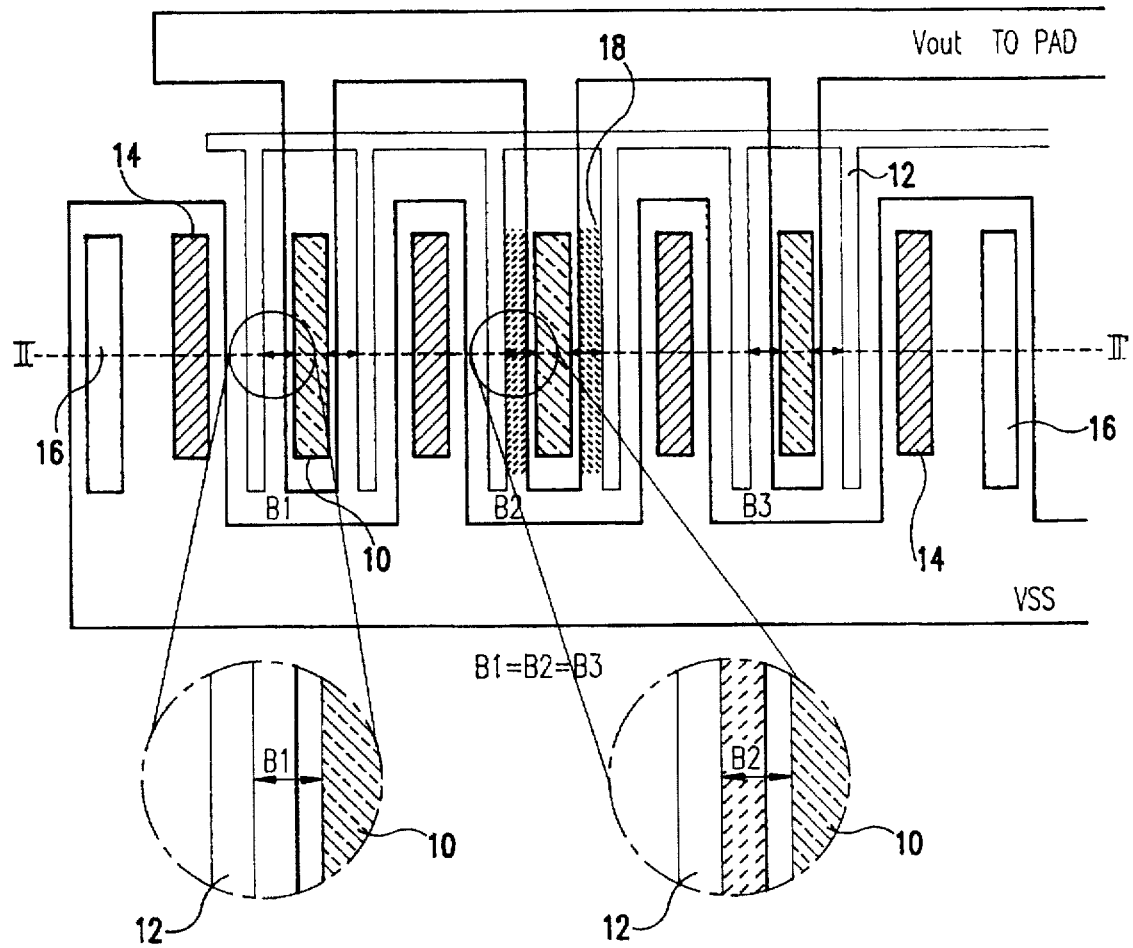
FIG. 1A is a plan view showing an input/output layout of a conventional NMOS electrostic protective device and FIGS. 1B and 1C are enlarged views of portions of FIG. 1A.
Figure 2:
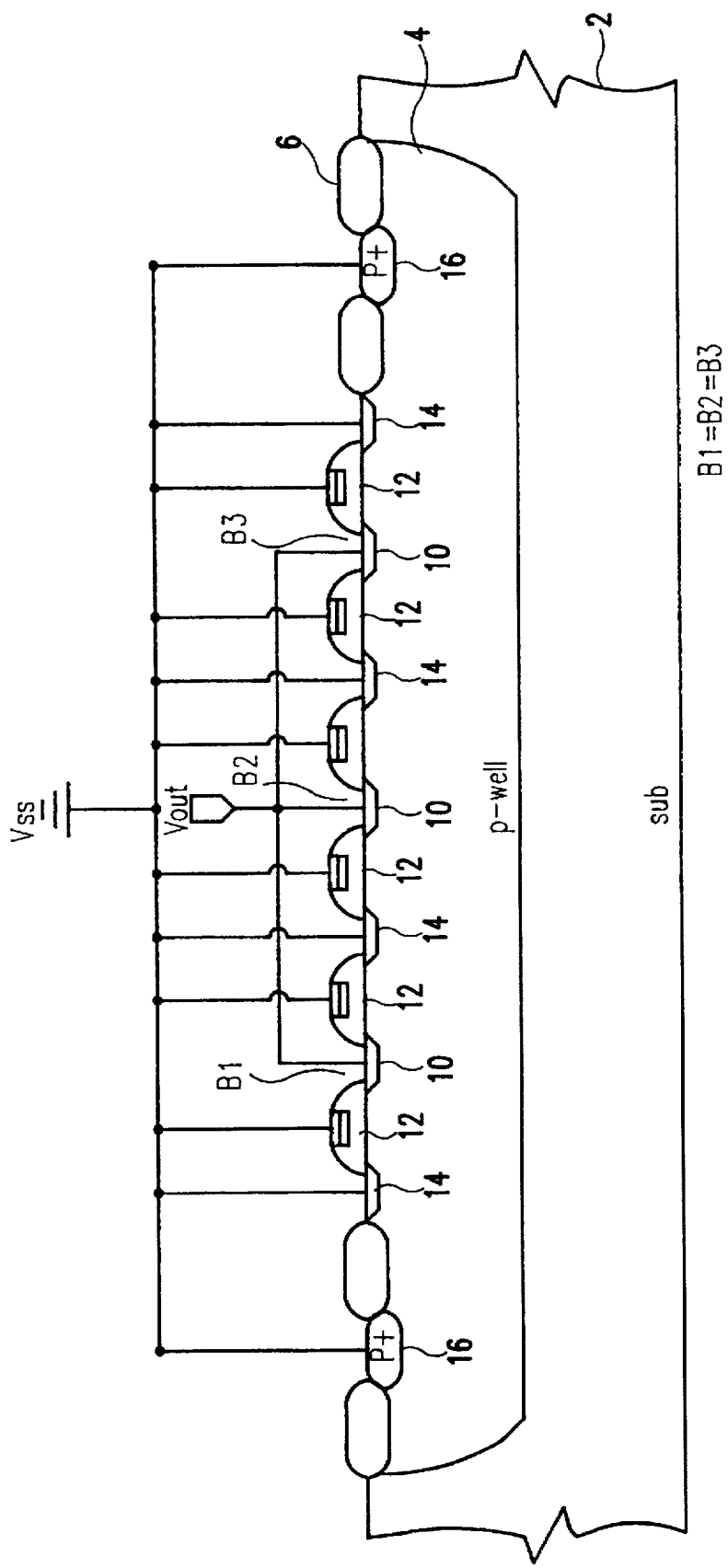
FIG. 2 is a cross-sectional view taken along line II—II' of FIG. 1.

As illustrated in FIG. 5, when a stress current $I_{stress}$ occurs, the drain voltage (output voltage) Vout of a conventional electrostatic protective device as shown in FIGS. 1 and 2 is characterized by a curve S1, whereas the drain voltage (output voltage) Vout of the electrostatic protective device of the present invention as shown in FIGS. 3A and 4 is characterized by a curve S2. As a result, as can be seen from the curve S2, overcurrent is made to flow into the other drains of the device of the present invention. Thus, most of the holes generated in the drains as a result of impact ionization are not stored in the source junction which is spaced furthest away from the well contact 26. As a result, the above-described problem of current localization can be prevented.

As described above, the electrostatic protective device of the present invention is characterized by making a distance between a first drain contact which is spaced furthest away from a well contact and each of adjacent gates on opposite side of the drain contact larger than a distance between the remaining drain contacts and the adjacent gates on opposite sides thereof, so that current does not localize at the first drain junction and instead flows into the remaining drain junctions. Current localization at the first drain junction is thus prevented.

What I claim is:

1. An electrostatic protective device having a ladder structure, comprising:

a semiconductor substrate;

a well, having two well contacts, formed on said semiconductor substrate; and, a plurality of MOS transistors formed on said well in series between said two well contacts, each of said MOS transistors including a drain connected to a first power source, a source connected to a second power source, and a gate connected to the second power source, wherein said gates of said MOS transistors are composed of gate fingers arranged in parallel to one another;

wherein a first width between a first drain which is spaced furthest away from said well contacts and each of adjacent gates located on opposite sides of said first drain is greater than a second width between each of the other drains and each of adjacent gates located on opposite sides of said other drains.

2. An electrostatic protective device as claimed in claim 1, wherein each of said MOS transistors is composed of an N-channel MOS transistor.

3. An electrostatic protective device comprising a plurality of MOS transistors having a ladder structure which is coupled to an input of an internal circuit between first and second voltage sources, and which includes a plurality of gate fingers arranged in parallel to one another and a plurality of source and drain contacts alternately arranged between said gate fingers, said ladder structure having a first width which is greater than a second width, the first width being a distance between a first drain contact which is spaced furthest from a well contact on a semiconductor substrate and each of adjacent gate fingers located on opposite sides of said first drain contact, and the second width being a distance between each of the other drain contacts and each of adjacent gate fingers located on opposite sides of said other drain contacts.

4. An electrostatic protective device as claimed in claim 3, wherein each of said MOS transistors is composed of an N-channel MOS transistor.

5. In an electrostatic protective device in which a plurality of transistors are aligned to form a ladder structure between two well contacts in a semiconductor substrate, the ladder structure including a plurality of elongate gate contacts extending parallel to one another, a plurality of elongate source contacts extending parallel to one another, and a plurality of elongate drain contacts extending parallel to one another, wherein the source contacts and the drain contacts are alternately arranged between the gate contacts, the improvement comprising a first distance being greater than a second distance to prevent current localization at respective junctions between a first drain contact and adjacent gate contacts located on opposite sides of said first drain contact, said first drain contact being a one of said plurality of drain contacts which is spaced furthest away from both said two well contacts, said first distance being a distance between said first drain contact and each of said adjacent gate contacts located on opposite sides of said first drain contact, and said second distance being a distance between each of the remaining drain contacts and each of the gate contacts adjacent to said remaining drain contacts.

6. In an electrostatic protective device as claimed in claim 5, wherein said transistors are MOS transistors.

7. In an electrostatic protective device as claimed in claim 6, wherein said gate contacts and said source contacts are electrically connected to one another.

* * * * *